(12) United States Patent
Nakamura

(10) Patent No.: US 7,176,127 B2
(45) Date of Patent: Feb. 13, 2007

(54) METHOD OF MANUFACTURING SEMICONDUCTOR DEVICE HAVING THROUGH HOLE WITH ADHESION LAYER THEREON

(75) Inventor: Makiko Nakamura, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 11/083,311

(22) Filed: Mar. 18, 2005

(65) Prior Publication Data

US 2005/0161831 A1 Jul. 28, 2005

Related U.S. Application Data

(62) Division of application No. 10/682,838, filed on Oct. 10, 2003, now abandoned.

(30) Foreign Application Priority Data

Oct. 18, 2002 (JP) .............................. 2002-303670

(51) Int. Cl.
H01L 21/4763 (2006.01)
(52) U.S. Cl. .............................. 438/639; 257/E21.597
(58) Field of Classification Search ................ 438/639; 257/E21.597
See application file for complete search history.

(56) References Cited

U.S. PATENT DOCUMENTS

| | | | | |
|---|---|---|---|---|
| 5,308,793 A | * | 5/1994 | Taguchi et al. | 438/642 |
| 5,486,492 A | * | 1/1996 | Yamamoto et al. | 438/629 |
| 5,913,141 A | * | 6/1999 | Bothra | 438/625 |
| 5,930,669 A | | 7/1999 | Uzoh | |
| 5,981,378 A | * | 11/1999 | Bothra | 438/637 |
| 6,130,154 A | | 10/2000 | Yokoyama et al. | |
| 6,133,142 A | * | 10/2000 | Tran et al. | 438/625 |
| 6,232,221 B1 | * | 5/2001 | Tran et al. | 438/637 |
| 6,258,649 B1 | | 7/2001 | Nakamura et al. | |
| 6,274,475 B1 | * | 8/2001 | Shields | 438/622 |
| 6,329,681 B1 | | 12/2001 | Nakamura et al. | |
| 6,348,402 B1 | * | 2/2002 | Kawanoue et al. | 438/618 |
| 6,358,835 B1 | | 3/2002 | Kanamura | |
| 6,444,575 B1 | * | 9/2002 | Yu et al. | 438/639 |
| 6,448,657 B1 | * | 9/2002 | Dorleans | 257/774 |

(Continued)

FOREIGN PATENT DOCUMENTS

JP 10-284603 10/1998

(Continued)

OTHER PUBLICATIONS

Stanley Wolf and Richard N. Tauber, Silicon Processing For The VLSI Era, 2000, Lattice Press, Second Edition, pp. 475-483.*

*Primary Examiner*—Michael Lebentritt
*Assistant Examiner*—Stanetta Isaac
(74) *Attorney, Agent, or Firm*—Volentine Francos & Whitt, PLLC

(57) ABSTRACT

An adhesion layer for causing a plug for electrically connecting a lower wiring and an upper wiring opposite to each other with an interlayer insulating film interposed therebetween to adhere to the interlayer insulating film is formed within a through hole for forming the plug, based on a predetermined aspect ratio represented by a ratio of a depth dimension of the through hole to a diameter dimension of the through hole.

13 Claims, 9 Drawing Sheets

U.S. PATENT DOCUMENTS

| | | |
|---|---|---|
| 6,509,277 B1 | 1/2003 | Saito et al. |
| 6,593,230 B1* | 7/2003 | Kuroda ............ 438/637 |
| 6,717,202 B2 | 4/2004 | Sugawara et al. |
| 2003/0036260 A1* | 2/2003 | Nakamura ............ 438/622 |
| 2003/0148603 A1* | 8/2003 | Gardner ............ 438/637 |

FOREIGN PATENT DOCUMENTS

| | | |
|---|---|---|
| JP | 11-040516 | 2/1999 |
| JP | 2000-091425 | 3/2000 |

* cited by examiner

METHOD OF MANUFACTURING SEMICONDUCTOR DEVICE HAVING THROUGH HOLE WITH ADHESION LAYER THEREON

CROSS REFERENCE TO RELATED APPLICATIONS

This is a divisional application of application Ser. No. 10/682,838, filed Oct. 10, 2003, now abandoned which is hereby incorporated by reference in its entirety for all purposes.

BACKGROUND OF THE INVENTION

1. Field of the Invention

The present invention relates to a semiconductor device and a method of manufacturing the same, and more specifically to a semiconductor device in which wiring is carried out in multilayered form, and a manufacturing method thereof.

2. Description of the Related Art

A highly integrated semiconductor device has been formed with wirings provided in multilayered form. The semiconductor device includes wirings provided in multilayered form with an interlayer insulating film low in dielectric constant interposed therebetween. The wirings of the respective layers are electrically connected to each other via a through hole defined in the interlayer insulating film. Such a conventional semiconductor device 200 will be explained using FIG. 10.

The semiconductor device 200 includes a semiconductor substrate 211 formed with an unillustrated semiconductor element, an insulating film 212 formed on the substrate 211, a high melting-point metal layer 213 formed on the insulating film 212, a lower wiring 216 made up of an aluminum alloy layer 214 made of aluminum and copper, which is formed on the high melting-point metal layer 213, and a cap metal layer 215 formed on the alloy layer 214, an interlayer insulating film 217 formed on the insulating film 212 so as to cover the lower wiring 216, a through hole 218 defined in the interlayer insulating film located on the lower wiring 216, an adhesion layer 219 provided within the through hole 218, a plug 220 formed within the through hole 218 in which the adhesion layer 219 is formed, and an upper wiring 221 electrically connected to the lower wiring 216.

A method of manufacturing the above-described conventional semiconductor device 200 will next be described.

An insulating film 212 is deposited on a semiconductor substrate 211 formed with an unillustrated semiconductor element. Thereafter, a layer of a high melting-point metal, which is obtained by laminating titanium nitride (TiN) and titanium (Ti), is formed on the insulating film 212. Afterwards, a layer of an aluminum alloy made of aluminum (Al) and copper (Cu) is formed on the high melting-point metal layer. Further, a laminated layer of titanium nitride and titanium, or a layer made of titanium alone is formed on the aluminum alloy layer as a layer of a cap metal. These high melting-point layer, aluminum alloy layer and a cap metal layer are patterned to predetermined shapes to form a lower wiring 216 comprising a high melting-point layer 213, an aluminum alloy layer 214 and a cap metal layer 215. After the formation of the lower wiring 216, an interlayer insulating film 217 is formed on the insulating film 212 so as to cover the lower wiring 216. Thereafter, a concave hole, which reaches from the surface on the interlayer insulating film 217 to the lower wiring 216, is formed as a through hole 218.

Afterwards, a cleaning process is effected on a bottom surface 222 of the through hole to remove a residual material developed upon formation of the through hole 218. Thereafter, an adhesion layer 219 using titanium nitride is formed on an inner wall of the through hole 218. A plug 220 using tungsten is formed within the through hole 218 in which the adhesion layer 219 is formed. After the formation of the plug 220, an upper wiring 221 is formed on the plug 220 by a process similar to that at the formation of the lower wiring 216.

In addition to the conventional semiconductor device 200, there is known a conventional semiconductor device wherein respective wirings of individual layers are electrically connected to each other without using different types of metals to thereby reduce resistance in a through hole (see Patent Document 1: Japanese Unexamined Patent Publication No. Hei 05-047940 (FIG. 1)).

Although an alloy made of aluminum, silicon and copper is formed as a plug within the through hole of the semiconductor device disclosed in the patent document 1, it is difficult to scale down or miniaturize the semiconductor device by use of the alloy in today when the diameter of the through hole, which is less than or equal to 0.5 µm, be in the mainstream. Accordingly, a plug using tungsten is formed in place of the above alloy nowadays.

SUMMARY OF THE INVENTION

Meanwhile, semiconductor devices faulty in operation were subject to fabrication where semiconductor devices 200 having various specs were manufactured by use of the above manufacturing method.

It turned out that as a result of investigations of the cause of a failure of each of such semiconductor devices faulty in operation, the value (hereinafter called through hole resistance) of resistance in a through hole of the semiconductor device was large.

Accordingly, an object of the present invention is to provide a semiconductor device low in through hole resistance, and a method of manufacturing the semiconductor device.

The present invention adopts the following constitutions to solve the above-described points.

An adhesion layer for causing a plug for electrically connecting a lower wiring and an upper wiring opposite to each other with an interlayer insulating film interposed therebetween to adhere to the interlayer insulating film can be formed by sputtering within a through hole for forming the plug, based on a predetermined aspect ratio indicated by a ratio of a depth dimension of the through hole to a diameter dimension of the through hole.

The adhesion layer lying within the through hole can be formed only on a sidewall of the through hole.

A thickness dimension of the adhesion layer on the lower wiring can be formed to a thickness dimension which causes gas having corrosion behavior to be penetrable.

Each of the lower wiring and the upper wiring can be formed to a laminated structure wherein a cap metal layer is provided on an aluminum alloy layer.

A high melting-point metal layer can be formed to a position to form the aluminum alloy layer prior to the formation of the aluminum alloy layer.

The aluminum alloy layer can be formed using an alloy made of aluminum and copper.

The cap metal layer can be formed of a laminated layer of titanium nitride and titanium, or a layer made of titanium nitride alone.

The high melting-point metal layer can be formed of a laminated layer of titanium nitride and titanium, or a layer made of titanium nitride alone.

A linear dimension of the lower wiring can be formed long.

The lower wiring can be formed as a first wiring on a semiconductor substrate having a semiconductor element.

The lower wiring can be formed in a floating state of being not directly connected to the semiconductor substrate having the semiconductor element.

The plug can be formed using tungsten.

The adhesion layer can be formed using titanium nitride.

The sputtering can be performed in such a manner that the relationship between a thickness dimension of a material deposited on the interlayer insulating film by the sputtering and the aspect ratio results in the fact that when the aspect ratio is over 2.5 and less than 3, the thickness dimension of the deposited material ranges from over 7.5 nm to under 10 nm, when the aspect ratio is over 3 and less than 3.5, the thickness dimension of the deposited material ranges from over 7.5 nm to under 20 nm, and when the aspect ratio is over 3.5 and less than 4, the thickness dimension of the deposited material ranges from over 7.5 nm to under 30 nm.

The sputtering can be performed from every direction at an incident angle of 5° or more with respect to a target to be sputtered.

The sputtering can be performed in such a manner that the relationship between the aspect ratio and the incident angle results in the fact that the incident angle at the time that the aspect ratio is over 1 and less than 1.5, is 45° or more, the incident angle at the time that the aspect ratio is over 1.5 and less than 2, is 26° or more, and the incident angle at the time that the aspect ratio is over 2.5 and less than 3, is 18° or more.

There is provided a semiconductor device comprising lower wiring and an upper wiring opposite to each other via a through hole defined in an interlayer insulating film, a plug for electrically connecting the lower wiring and the upper wiring to each other within the through hole, and an adhesion layer for causing the plug to adhere to the interlayer insulating film within the through hole, wherein the adhesion layer is formed based on a predetermined aspect ratio represented by a ratio of a depth dimension of the through hole to a diameter dimension thereof.

The adhesion-layer lying within the through hole can be formed only on a sidewall of the through hole.

A thickness dimension of the adhesion layer on the lower wiring can be formed to a thickness dimension which causes gas having corrosion behavior to be penetrable.

Each of the lower wiring and the upper wiring can be formed to a laminated structure wherein a cap metal layer is provided on an aluminum alloy layer.

Each of the lower wiring and the upper wiring can be formed to a structure having a high melting-point metal layer provided below the aluminum alloy layer.

The aluminum alloy layer can be formed of an alloy made of aluminum and copper.

The cap metal layer can be formed of a laminated layer of titanium nitride and titanium, or a layer made of titanium nitride alone.

The high melting-point metal layer can be formed of a laminated layer of titanium nitride and titanium, or a layer made of titanium nitride alone.

A linear dimension of the lower wiring can be formed long.

The lower wiring can be formed as a first wiring on a semiconductor substrate having a semiconductor element.

The lower wiring can be formed as a wiring held in a floating state of being not directly connected to the semiconductor substrate having the semiconductor element.

The plug can be formed by a tungsten plug.

The adhesion layer can be formed using titanium nitride.

The adhesion layer can be formed such that the relationship between a thickness dimension of a material deposited on the interlayer insulating film by the sputtering and the aspect ratio results in the fact that when the aspect ratio is over 2.5 and less than 3, the thickness dimension of the deposited material ranges from over 7.5 nm to under 10 nm, when the aspect ratio is over 3 and less than 3.5, the thickness dimension of the deposited material ranges from over 7.5 nm to under 20 nm, and when the aspect ratio is over 3.5 and less than 4, the thickness dimension of the deposited material ranges from over 7.5 nm to under 30 nm.

The adhesion layer is formed by sputtering having directivity. Sputtering can be effected on an object to be sputtered from every direction at an incident angle of 5° or more.

The adhesion layer can be formed such that the relationship between the aspect ratio and the incident angle results in the fact that the incident angle at the time that the aspect ratio is over 1 and less than 1.5, is 45° or more, the incident angle at the time that the aspect ratio is over 1.5 and less than 2, is 26° or more, and the incident angle at the time that the aspect ratio is over 2.5 and less than 3, is 18° or more.

A prehistory of the present invention will be explained below prior to the description of embodiments of the present invention.

The present inventors have repeated experiments to determine whether in a multilayered wiring type semiconductor device, the resistant value of a through hole resistance of the semiconductor device is large in any specs and to specify specs thereof. As a result, the present inventors found out that the value of the through hole resistance increased in particular in the case of a certain specific wiring pattern. That is, the wiring pattern corresponds to a wiring corresponding to a first layer on a semiconductor substrate, which is very long, and is a wiring pattern which is floated from the semiconductor substrate, i.e., which is not directly connected to the semiconductor substrate.

Next, the present inventors have considered that at the wiring pattern, the whole wiring is charged when a wiring is formed, so that some substances (hereinafter called foreign substances) are adhered to the boundary (hereinafter called bottom surface of a through hole) between the wiring and the through hole formed on the wiring, or formed at the boundary, whereby the foreign substances could result in an increase in through hole resistance value. However, the present inventors could not clarify the cause of their production and their composition.

The present inventors have repeatedly conducted experiments even subsequently. The present inventors have found out a remarkable result from an experiment shown next.

Such an experiment is as follows: A semiconductor device wherein a thickness dimension of an adhesion layer (titanium nitride layer) deposited on a bottom surface of a through hole was set to 0.75 nm, and a semiconductor device wherein it was set to 3 nm, were respectively produced using a testing wiring pattern shown in FIG. 11. The values of through hole resistances employed in the respective semiconductor devices were measured. Results thereof were summarized in a graph shown in FIG. 12.

That is, the testing wiring pattern structure shown in FIG. 11 includes a first wiring M1 in which a wiring lying within a range surrounded by a broken line is configured as a lower wiring, a second wiring M2 configured as an upper wiring, a through hole Via in which a plug for electrically connecting the first wiring M1 and the second wiring M2 to each other is formed, and measuring terminals Pad for electrically connecting the wirings and a measuring device. A linear dimension of the lower wiring M1 is 100 mm and a width dimension thereof is 0.52 μm. Further, a diameter dimension of the through hole is 0.26 μm.

Using the testing wiring pattern referred to above, a semiconductor device wherein titanium nitride for an adhesion layer was deposited on a bottom surface of a through hole Via in a thickness dimension of 0.75 nm was produced. A semiconductor device wherein it was deposited thereon in a thickness dimension of 3 nm was produced. Then the values of through hole resistances employed in the former and latter semiconductor devices were respectively measured. Their measured results were summarized in the graph of FIG. 12. The graph of FIG. 12 is a cumulative normal distribution diagram in which a distribution of through hole resistance values at the time that the thickness dimension of the deposited titanium nitride is 0.75, is represented by "+", and a distribution of through hole resistance values at the time that the thickness dimension thereof is 3 nm, is represented by "○". It turned out that as the thickness dimension of the titanium nitride at the bottom surface of the through hole became thin as shown in the figure, the through hole resistance value became low.

It was found out by carrying out further repeated experiments that a semiconductor device formed with no adhesion layer at a bottom surface of a through hole was capable of reducing a through hole resistance value.

Further, this invention includes the following the aspects.

1. A method of manufacturing a semiconductor device, comprising the following step:

forming, by sputtering, an adhesion layer for causing a plug for electrically connecting a lower wiring and an upper wiring opposite to each other with an interlayer insulating film interposed therebetween to adhere to the interlayer insulating film, within a through hole for forming the plug, based on a predetermined aspect ratio indicated by a ratio of a depth dimension of the through hole to a diameter dimension of the through hole.

2. The method according to claim 1, wherein the adhesion layer lying within the through hole is formed only on a sidewall of the through hole.

3. The method according to claim 2, wherein a thickness dimension of the adhesion layer on the lower wiring is formed to a thickness dimension which causes gas having corrosion behavior to be penetrable.

4. The method according to claim 1, wherein each of the lower wiring and the upper wiring is formed to a laminated structure wherein a cap metal layer is provided on an aluminum alloy layer.

5. The method according to claim 4, wherein a high melting-point metal layer is formed to a position to form the aluminum alloy layer prior to the formation of the aluminum alloy layer.

6. The method according to claim 4, wherein the aluminum alloy layer is formed using an alloy made of aluminum and copper.

7. The method according to claim 4, wherein the cap metal layer is formed of a laminated layer of titanium nitride and titanium, or a layer made of titanium nitride alone.

8. The method according to claim 5, wherein the high melting-point metal layer is formed of a laminated layer of titanium nitride and titanium, or a layer made of titanium nitride alone.

9. The method according to claim 1, wherein a linear dimension of the lower wiring is formed long.

10. The method according to claim 1, wherein the lower wiring is formed as a first wiring on a semiconductor substrate having a semiconductor element.

11. The method according to claim 1, wherein the lower wiring is formed in a floating state of being not directly connected to the semiconductor substrate having the semiconductor element.

12. The method according to claim 1, wherein the plug is formed using tungsten.

13. The method according to claim 1, wherein the adhesion layer is formed using titanium nitride.

14. The method according to claim 1, wherein said sputtering is performed in such a manner that the relationship between a thickness dimension of a material deposited on the interlayer insulating film by said sputtering and the aspect ratio results in the fact that when the aspect ratio is over 2.5 and less than 3, the thickness dimension of the deposited material ranges from over 7.5 nm to under 10 nm, when the aspect ratio is over 3 and less than 3.5, the thickness dimension of the deposited material ranges from over 7.5 nm to under 20 nm, and when the aspect ratio is over 3.5 and less than 4, the thickness dimension of the deposited material ranges from over 7.5 nm to under 30 nm.

15. The method according to claim 1, wherein said sputtering is performed from every direction at an incident angle of 5° or more with respect to a target to be sputtered.

16. The method according to claim 15, wherein said sputtering is performed in such a manner that the relationship between the aspect ratio and the incident angle results in the fact that the incident angle at the time that the aspect ratio is over 1 and less than 1.5, is 45° or more, the incident angle at the time that the aspect ratio is over 1.5 and less than 2, is 26° or more, and the incident angle at the time that the aspect ratio is over 2.5 and less than 3, is 18° or more.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be explained using the accompanying drawings on the basis of the above-described findings.

Specific Embodiment 1

Figure 1:
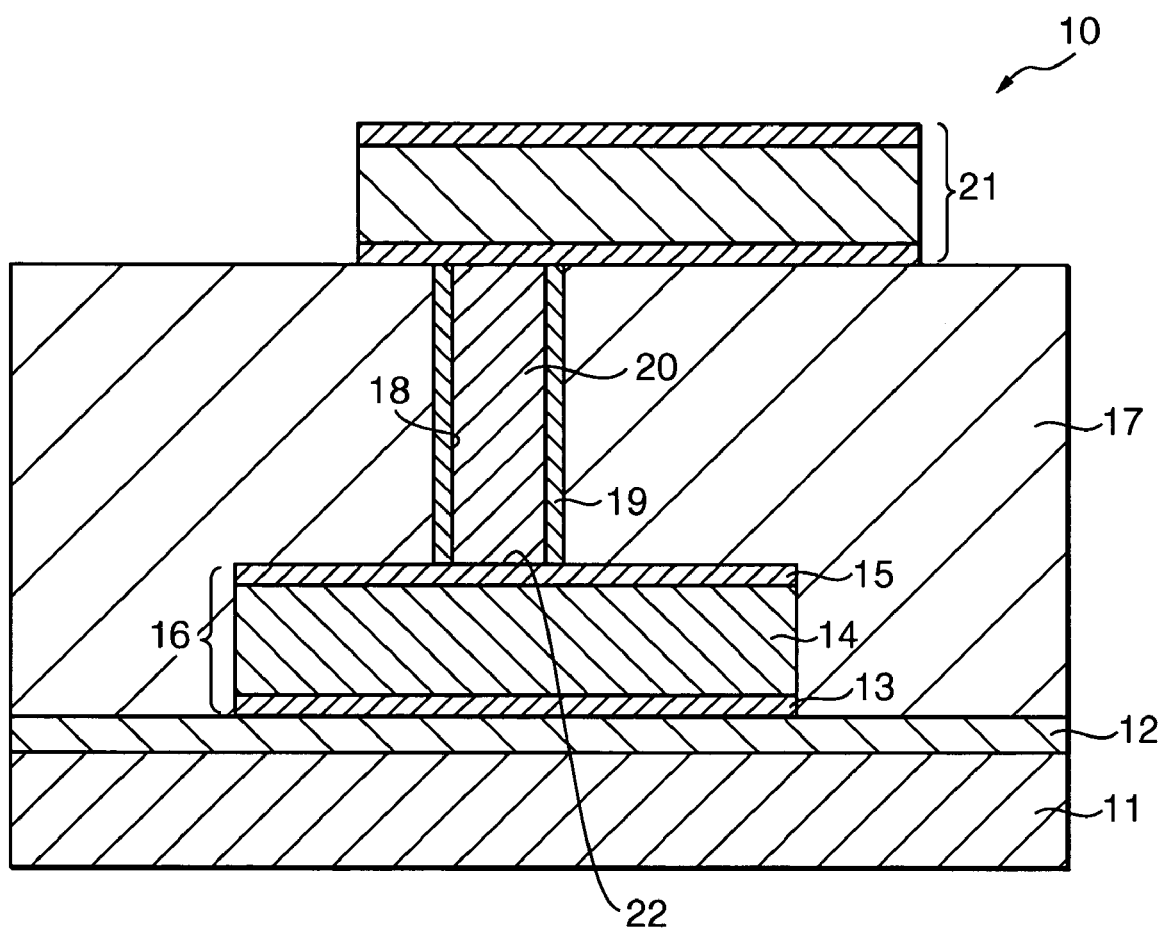
FIG. 1 is a cross-sectional view showing a semiconductor device according to a specific embodiment 1.

FIG. 1 is a cross-sectional view showing a semiconductor device 10 according to a specific embodiment 1.

The semiconductor device 10 includes a semiconductor substrate 11 formed with an unillustrated semiconductor element, an insulating film 12 formed on the substrate 11, a high melting-point metal layer 13 produced at a predetermined position on the insulating film 12, a lower wiring 16 made up of an aluminum alloy layer 14 produced on the high melting-point metal layer 13 and a cap metal layer 15 produced on the alloy layer 14, an interlayer insulating film 17 formed for wiring lamination, a through hole 18 defined in the interlayer insulating film 17 located on the lower wiring 16, an adhesion layer 19 formed within the through hole 18, a plug 20 formed within the through hole in which the adhesion layer 19 is provided, and an upper wiring 21 formed on the plug 20.

The lower wiring 16 is a first wiring on the semiconductor substrate 11. The wiring is not directly electrically connected to the semiconductor substrate. The linear dimension of the wiring is long and has a linear dimension of a few tens of mm. Further, the lower wiring 16 has a multilayer structure comprising the high melting-point metal layer 13, aluminum alloy layer 14 and cap metal layer 15 for the purpose of an improvement in performance and prevention of reflection in a photolithography process.

A method of manufacturing the semiconductor device 10 will next be explained using FIGS. 1 through 4.

Figure 2:
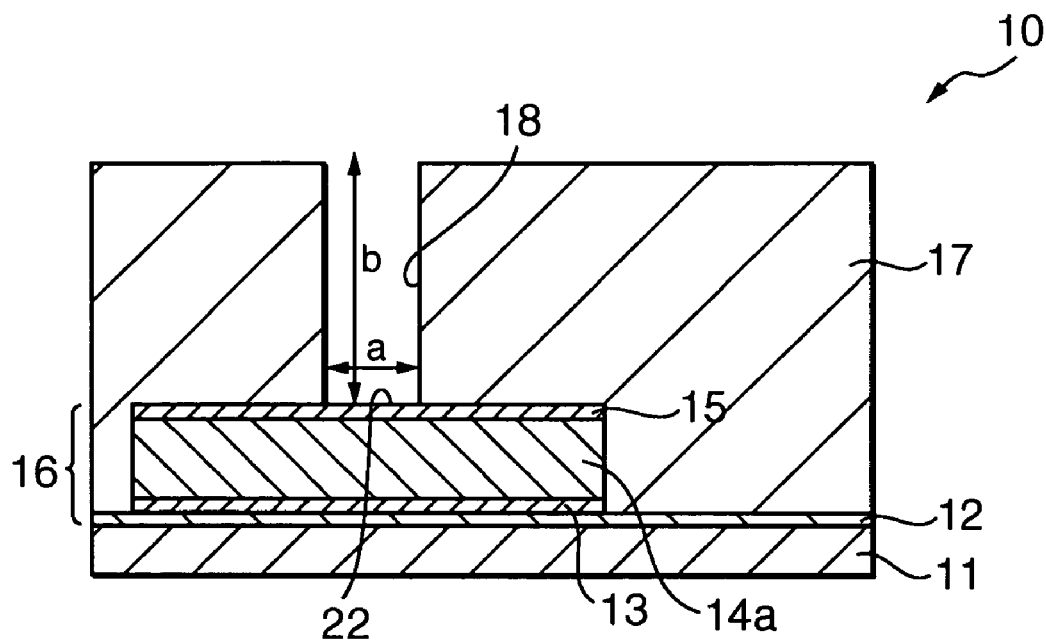
FIG. 2 is a cross-sectional view illustrating an aspect ratio and a through hole.

As shown in FIG. 2, an insulating film 12 is first formed on a semiconductor substrate 11 having an unillustrated semiconductor element.

Next, a layer for a high melting-point metal layer 13, which is formed with a 20-nm film made of titanium and a 20-nm film made of titanium nitride, is formed on the insulating film 12 to form a lower wiring 16 sequentially laminated using a sputtering method. After the layer for the high melting-point metal layer 13 has been formed, a layer for an aluminum alloy layer 14, which is made of aluminum and copper, is formed 400 nm thick on the layer 13. Further, a layer for a cap metal layer 15, which is formed with a 5-nm film made of titanium and a 50-nm film made of titanium nitride, is formed on the layer for the aluminum alloy layer 14. Next, an unillustrated resist film is disposed on the layer for the cap metal layer 15 in a predetermined pattern. Afterwards, the layer for the cap metal layer 15, the layer for the aluminum alloy layer 14, and the layer for the high melting-point metal layer 13 are etched to form the lower wiring 16 having a predetermined wiring pattern, which is made up of the high melting-point metal layer 13, the aluminum alloy layer 14 and the cap metal layer 15.

After the formation of the lower wiring 16, a silicon oxide film is formed on the insulating film 12 as an interlayer insulating film 17 by a high-density plasma method, for example. The interlayer insulating film 17 is formed in a predetermined thickness dimension so as to cover the lower wiring 16. Next, an unillustrated resist film is disposed on the interlayer insulating film 17 in a predetermined pattern and thereafter the interlayer insulating film uncovered by the resist film is etched to define a through hole 18.

As shown in FIG. 2, an aspect ratio represented by a ratio of a depth dimension b (b=3.5) of the through hole 18 to a diameter dimension a (a=1) of the through hole 18 is given as 3.5. The through hole 18 having such an aspect ratio is formed by suitably adjusting the thickness dimension of the interlayer insulating film 17, the diameter dimension of the through hole 18 and the height dimension of the lower wiring 16.

After the formation of the through hole 18, a bottom surface 22 of the through hole 18 is etched by a sputter etching method. Consequently, the surface of the cap metal layer 15 of the lower wiring 16, which is exposed at the bottom surface 22 of the through hole 18, is cut or chipped away 5 nm thick.

Figure 3:
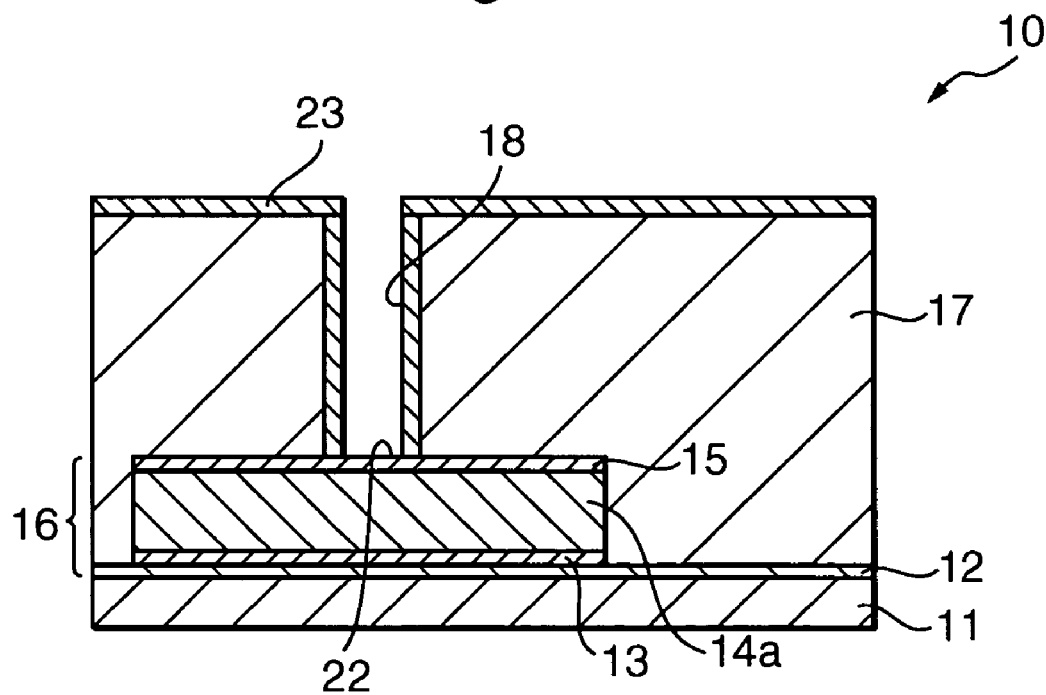
FIG. 3 is a cross-sectional view depicting a titanium nitride layer for an adhesion layer.

Afterward, as shown in FIG. 3, a layer 23 of titanium nitride for an adhesion layer 19 is formed on the interlayer insulating film 17 and within the through hole by a sputter method.

Figure 9:
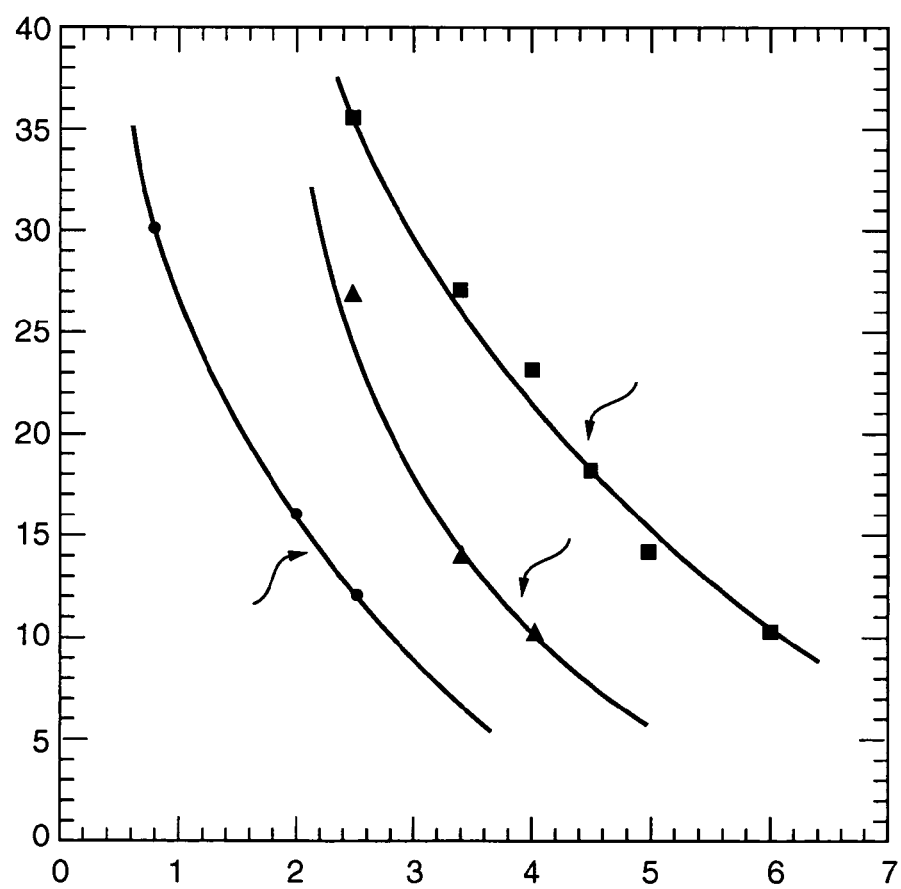
FIG. 9 is a graph showing the relationship between a through hole aspect ratio and bottom coverage of a through hole.
Figure 10:
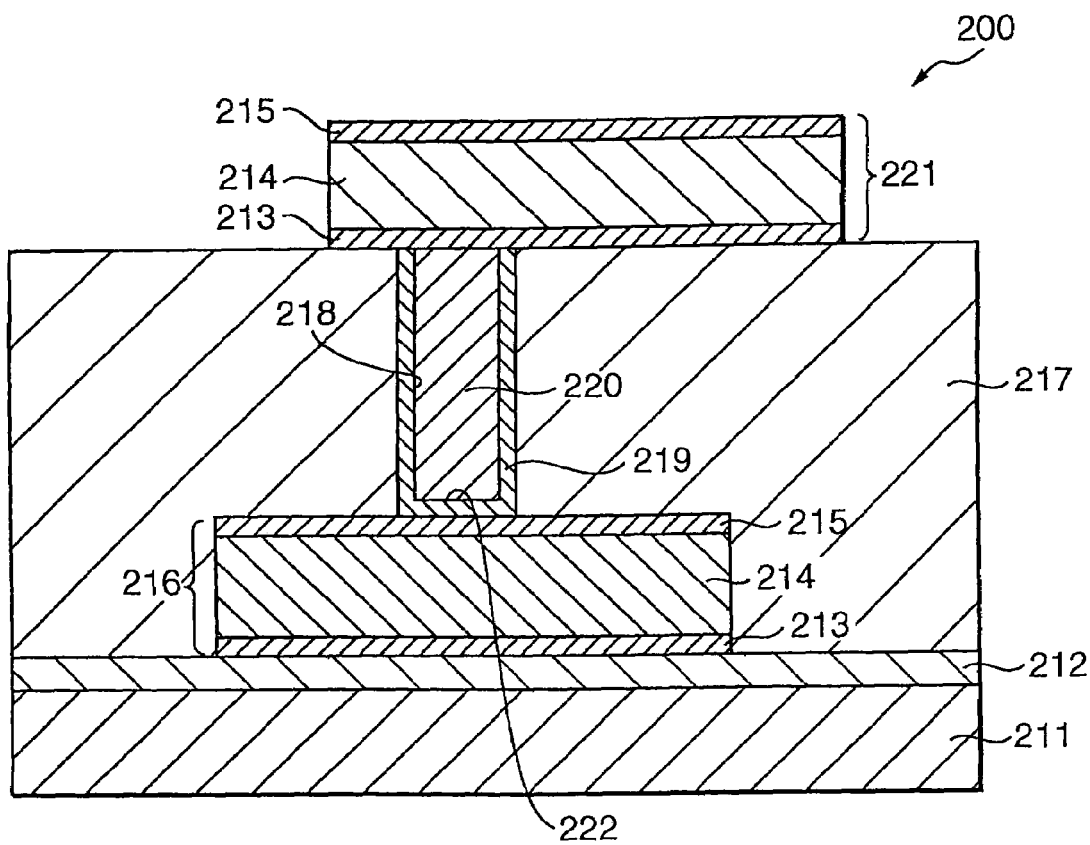
FIG. 10 is a cross-sectional view illustrating a conventional semiconductor device.
Figure 11:
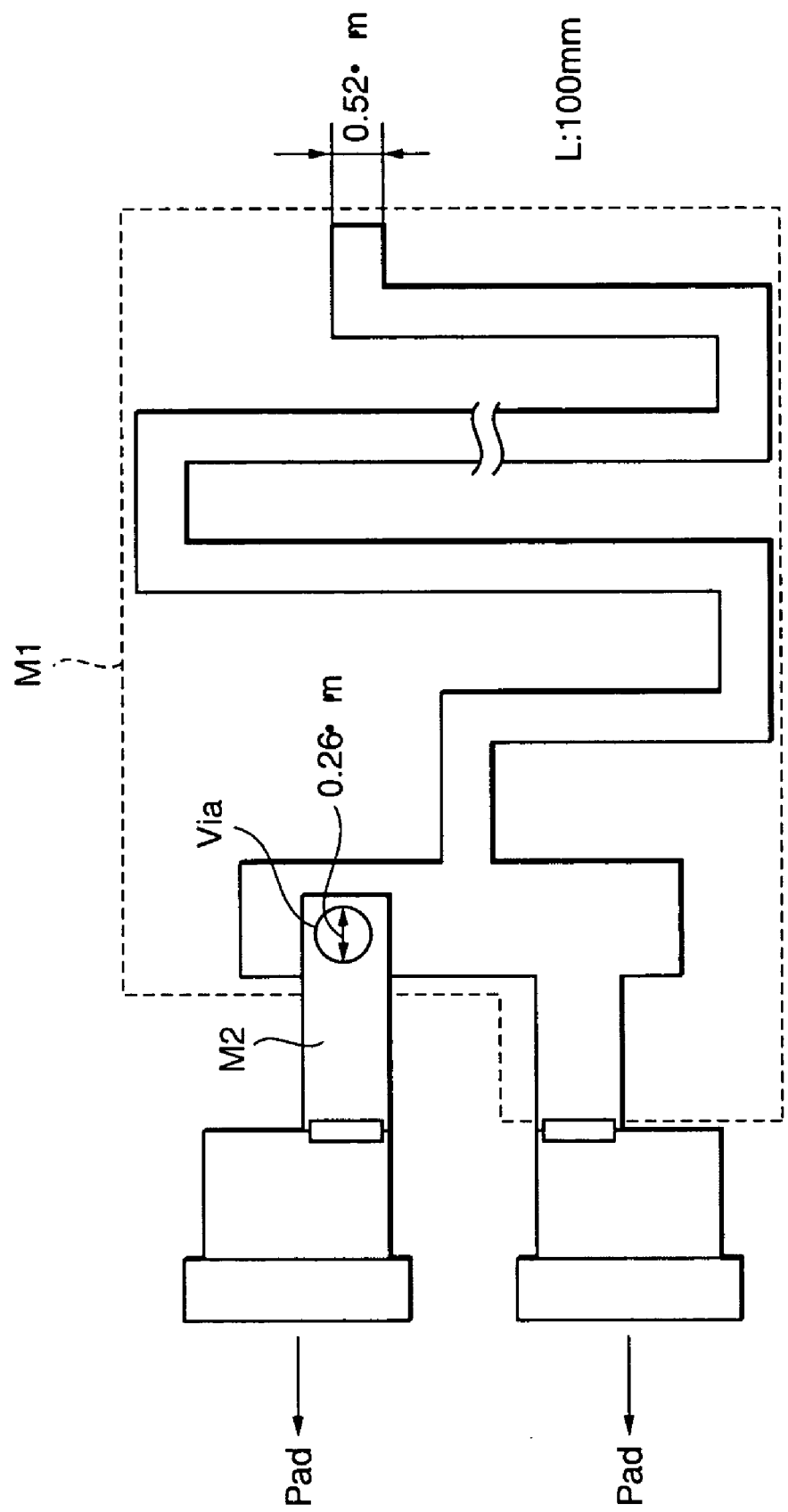
FIG. 11 is a view showing a testing wiring pattern.
Figure 12:
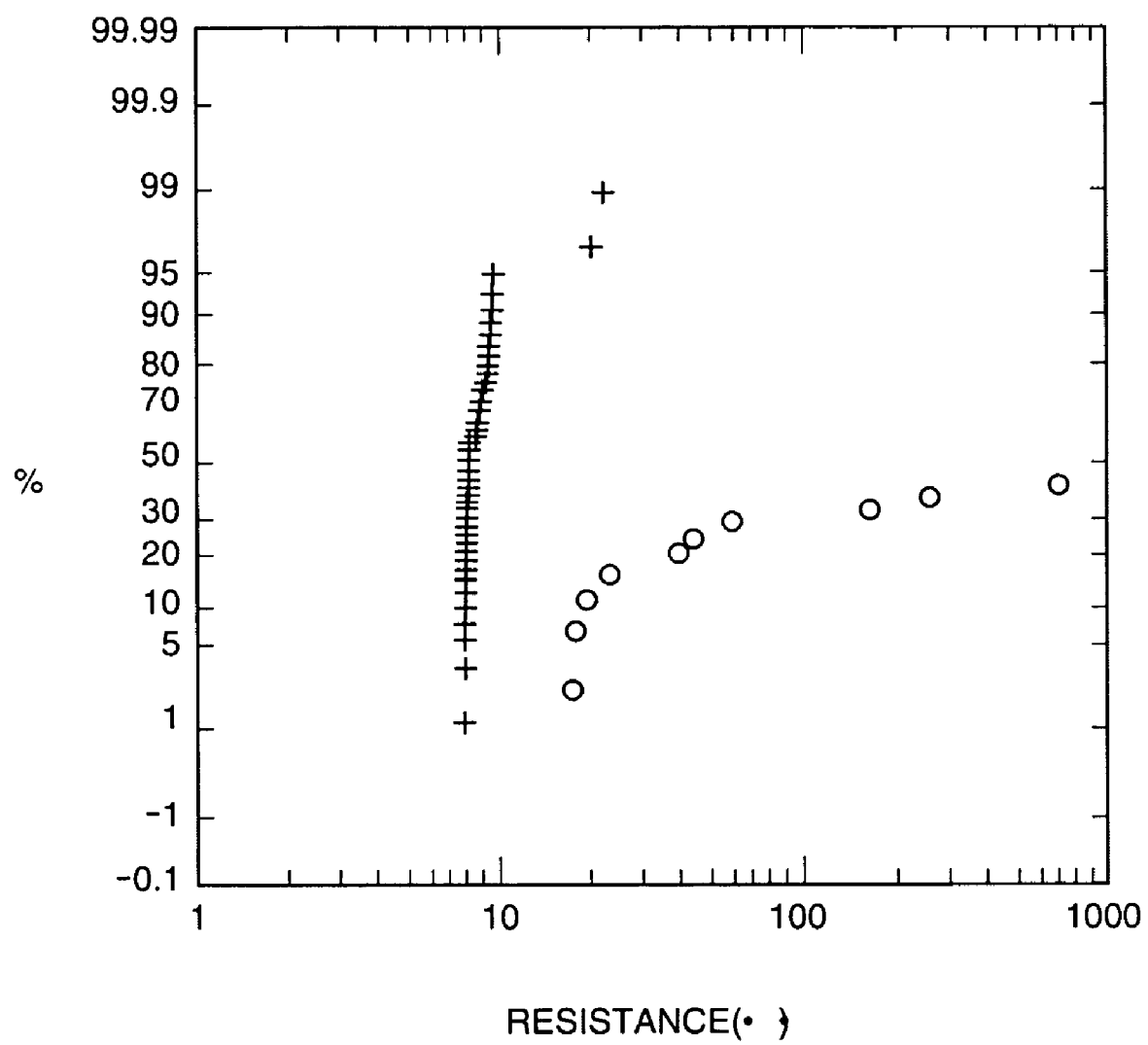
FIG. 12 is a graph illustrating distributions of through hole resistances.

While the titanium nitride layer 23 is deposited even on the lower wiring 16 exposed at the bottom surface 22 of the through hole, its linear dimension is set thinner than the thickness dimension of the layer deposited on the interlayer insulating film 17. Assuming that a titanium nitride layer 23 having a thickness dimension of 10 nm is formed on the interlayer insulating film by the sputter method under the above aspect ratio 3.5, for example, a titanium nitride layer having a thickness dimension of about 0.6 nm is formed at the bottom surface 22 of the through hole. This relationship is shown in FIG. 9. FIG. 9 shows the relationship between aspect ratios and bottom coverage at the bottom surface 22 of the through hole, which are obtained by three types of sputter methods different from one another. In the case of these sputter methods, particles applied from a target to an objective one or object are high in rectilinearity in order of a normal sputter, a long-range sputter B and a long-range sputter A.

On the other hand, it turned out that though the thickness dimension of the titanium nitride layer 23 deposited on the interlayer insulating film 17 was set thin in order to make thin the thickness dimension of the titanium nitride layer 23 deposited at the bottom surface 22 of the through hole, peeling occurred in the inner wall of the adhesion layer 19 with respect to the plug 20 or the inner wall of the through hole 18 with respect to the adhesion layer 19 or both inner walls after the formation of the adhesion layer 19 and the plug 20 to be described later in the case where the thickness dimension of the titanium nitride layer 23 deposited on the interlayer insulating film 17 was 7.5 nm or less, whereby sufficient adhesion was not ensured.

Figure 4:
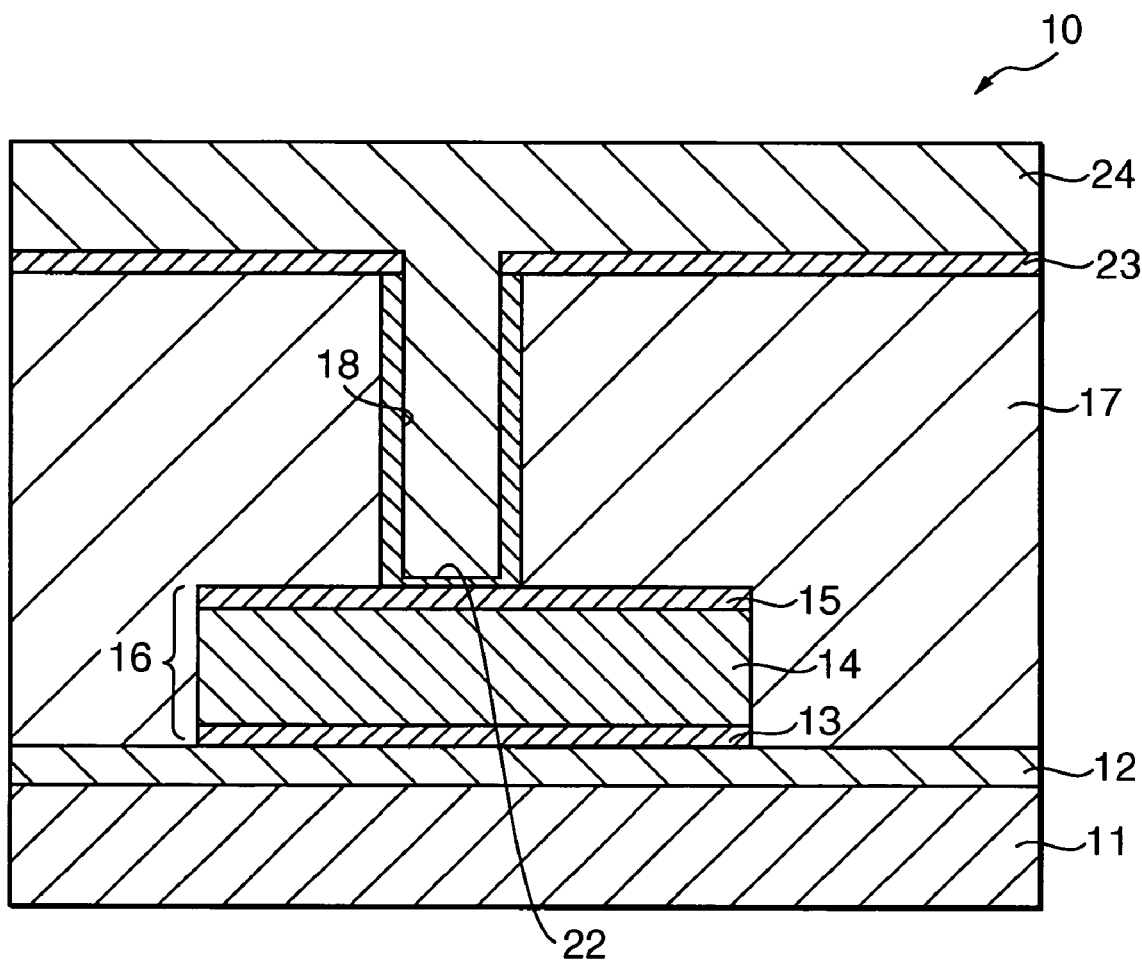
FIG. 4 is a cross-sectional view showing a tungsten layer for a plug.

After the formation of the titanium nitride layer 23, as shown in FIG. 4, a tungsten (W) portion for the plug 20 and a tungsten layer 24 (having a thickness dimension ranging from 300 nm to 500 nm) are next formed within the through hole 18 and on the titanium nitride layer 23 by a CVD (Chemical Vapor Deposition) method using tungsten hexafluoride gas ($WF_6$). After the formation of the tungsten layer 24, the extra titanium nitride layer 23 and tungsten layer 24 other than within the through hole are removed by CMP (Chemical Mechanical Polishing) or an etchback method as shown in FIG. 1. Afterwards, an upper wiring 21 having a structure identical to that of the lower wiring 16 is formed in the same manner as the lower wiring 16.

Owing to the formation of the adhesion layer 19 based on the predetermined aspect ratio as mentioned above, the thickness dimension of the adhesion layer at the bottom surface 22 of the through hole 18 can be made thin. It is therefore possible to manufacture a semiconductor device low in through hole resistance value. Accordingly, a failure in operation developed due to an increase in through hole resistance value can be prevented and hence a satisfactory semiconductor device can be obtained.

Further, since the semiconductor device of the present invention can be fabricated without using a special manufacturing apparatus, a capital investment can be suppressed and hence the semiconductor device of the present invention can be economically fabricated.

Incidentally, as the cause of a reduction in through hole resistance value, it is conceivable that when the thickness dimension of the adhesion layer formed at the bottom surface of the through hole is made thin, the tungsten hexafluoride gas having corrosion behavior is penetrated from the adhesion layer and foreign substances are eroded by the penetrated tungsten hexafluoride gas, followed by being removed.

Specific Embodiment 2

While the adhesion layer 19 employed in the specific embodiment 1 has been substantially uniformly formed in the predetermined thickness dimension from the upper portion of the inner wall of the through hole 18 to the lower portion thereof, the specific embodiment 2 will explain a method of forming an adhesion layer 31 whose thickness dimension gradually decreases as it extends from an upper portion of a through hole to a lower portion thereof.

Figure 5:
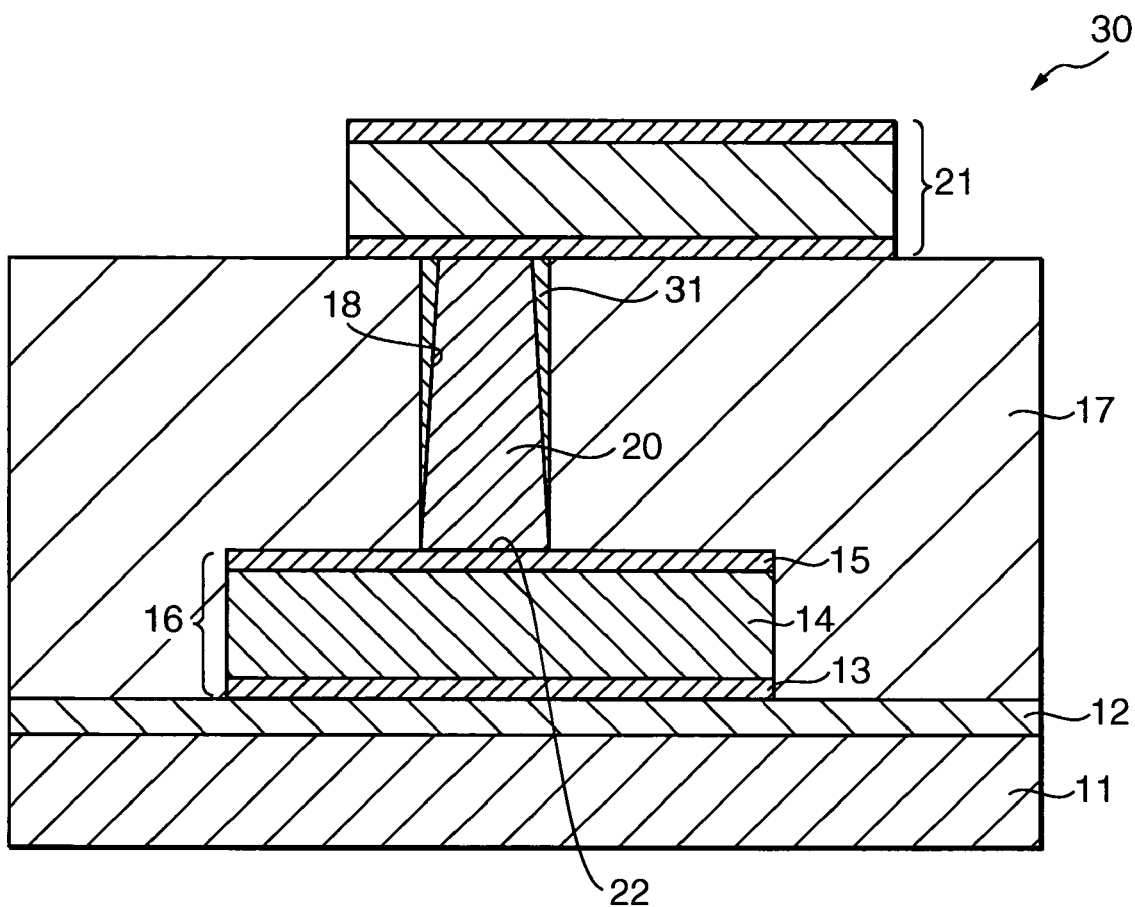
FIG. 5 is a cross-sectional view illustrating a semiconductor device according to a specific embodiment 2.

FIG. 5 is a cross-sectional view showing a semiconductor device 30 according to the specific embodiment 2.

The semiconductor device 30 includes a semiconductor substrate 11 formed with an unillustrated semiconductor element, an insulating film 12 formed on the substrate 11, a high melting-point metal layer 13 produced at a predetermined position on the insulating film 12, a lower wiring 16 made up of an aluminum alloy layer 14 formed on the high melting-point metal layer 13 and a cap metal layer 15 produced on the alloy layer 14, an interlayer insulating film 17 formed to laminate a wiring over the lower wiring 16, a through hole 18 defined in the interlayer insulating film 17 located on the lower wiring 16, an adhesion layer 31 whose thickness dimension gradually decreases as it extends from an upper portion of an inner wall of the through hole 18 to a lower portion thereof, a plug 20 formed within the through hole in which the adhesion layer 31 is provided, and an upper wiring 21 formed on the plug 20.

A method of manufacturing the semiconductor device 30 will next be described using FIGS. 6 through 8.

In a manner similar to the specific embodiment 1, an insulating film 12 is first formed to a predetermined position on a semiconductor substrate 11. Afterwards, a lower wiring 16 is formed which consists of a high melting-point metal layer 13, an aluminum alloy layer 14 and a cap metal layer 15.

Next, an interlayer insulating film 17 made up of a silicon oxide film is formed on the insulating film 12 so as to cover the lower wiring 16. Afterwards, photolitho etching is effected thereon to define a through hole 18 which exposes the surface of the lower wiring 16 at its bottom surface. After the formation of the through hole 18, the lower wiring exposed at the bottom surface 22 of the through hole 18 is etched by a sputter etching method so that the surface of the cap metal layer 15 of the lower wiring 16 is cut or chipped away 5 nm thick.

Figure 6:
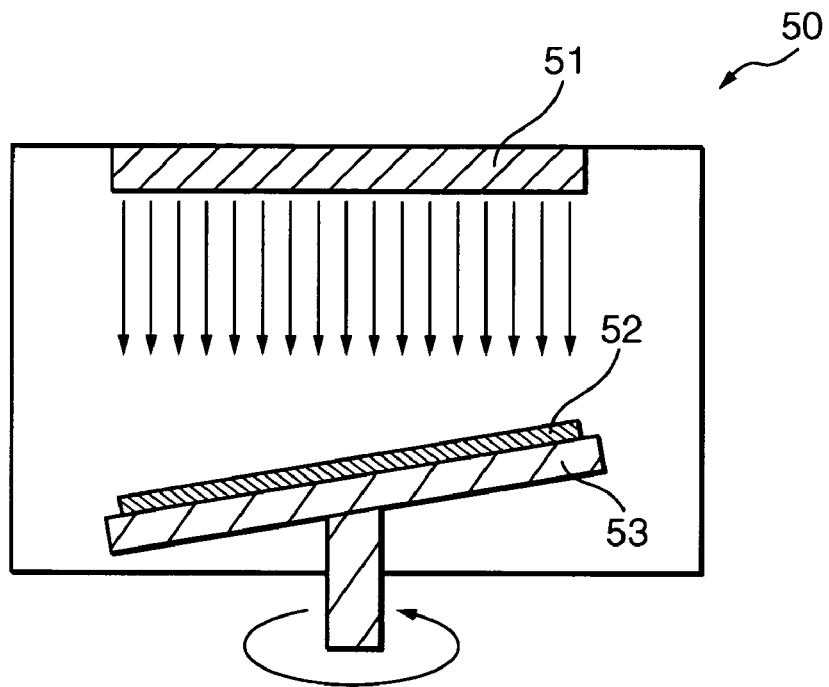
FIG. 6 is a cross-sectional view depicting a sputter system used in the specific embodiment 2.

A titanium nitride layer used for the adhesion layer 31, which shows the feature of the specific embodiment 2, is next formed by using a sputter system 50 shown in FIG. 6. The sputter system 50 is provided with a target 51 which applies particles of titanium nitride vertically from the surface of the ceiling thereof to its floor, and a susceptor 53 on which a wafer 52 comprising a plurality of semiconductor substrates 11 subjected to the processing up to the above-described manufacturing process is placed. The susceptor 53 has a predetermined angle with respect to the target 51. When the titanium nitride is sputtered from the target 51 to the wafer 52, the susceptor 53 is rotated counterclockwise while maintaining a predetermined speed.

The predetermined angle has been found out by repeating experiments and is determined depending on an aspect ratio of the through hole. When the aspect ratio is more than or equal to 1 and less than 1.5, the angle of incidence of the titanium nitride from the target 51 may preferably be 45° or more. When the aspect ratio is greater than or equal to 1.5 and less than 2, the angle of incidence of the titanium nitride from the target 51 may preferably be 26° or more. When the aspect ratio is greater than or equal to 2.5 and less than 3, the angle of incidence angle of the titanium nitride from the target 51 may preferably be 18° or more.

Figure 7:
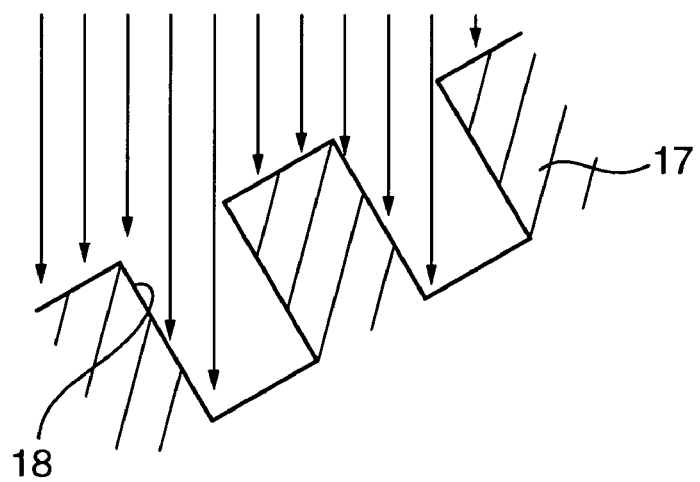
FIG. 7 is a view showing an interlayer insulating film and titanium nitride particles applied to through holes.
Figure 8:
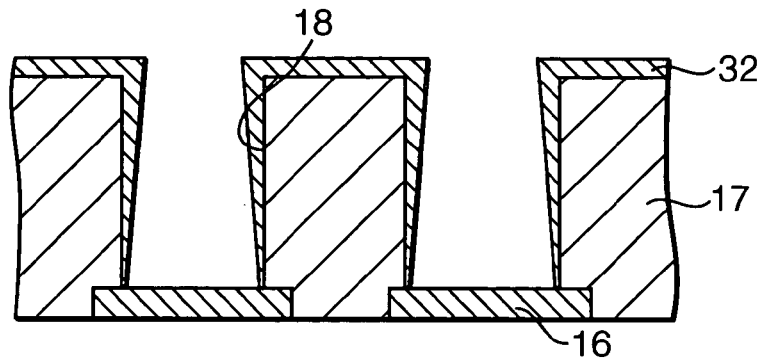
FIG. 8 is a cross-sectional view illustrating a titanium nitride layer employed in the specific embodiment 2.

With the use of the sputter system 50, the titanium nitride particles applied from the target 51 are applied to the interlayer insulating film 17 and the through holes 18 at a predetermined incident angle as shown in FIG. 7. With the rotation of the susceptor 53 counterclockwise while the predetermined speed is being maintained, a titanium nitride layer 32 is uniformly formed on its corresponding interlayer insulating film 17 as shown in FIG. 8. Thus, the titanium nitride layer 32 for an adhesion layer, whose thickness dimension gradually decreases from an upper portion of an inner wall of each through hole 18 defined in the interlayer insulating film 17 to a lower portion thereof, is formed on the inner wall of each through hole 18.

The titanium nitride layer 32 for the adhesion layer is not substantially formed at the bottom surface of each through hole 18.

After the formation of the titanium nitride layer 32, a tungsten layer for plugs 20 is formed in the through holes 18 in a manner similar to the specific embodiment 1. The tungsten layer is formed by a W-CVD method using tungsten hexafluoride gas $WF_6$.

After the formation of the tungsten layer, the extra titanium nitride layer 32 and tungsten layer other than within the through holes are removed. Thereafter, an upper layer wiring 21 having a structure identical to that mentioned above is formed in a manner similar to the specific embodiment 1.

As described above, the through holes 18 each having a predetermined aspect ratio are defined in the interlayer insulating film 17 and sputtered at a predetermined angle from all directions, whereby adhesion layers 31 each having a predetermined thickness dimension are formed on the inner walls of the through holes 18 without being deposited on the bottom surfaces 22 of the through holes. Therefore, adhesion is provided between the plug 20 and the interlayer insulating film 17, and a semiconductor device 30 low in through hole resistance value can be fabricated. It is thus possible to obtain a satisfactory semiconductor device 30 free of the occurrence of a failure in operation.

Further, the adhesion layer 31 can be formed even when the aspect ratio of the through hole 18 is less than 2.5. The adhesion layer 31 can be adapted for use in the manufacture of a miniaturized semiconductor device low in aspect ratio.

Since the adhesion layer 19 employed in the specific embodiment 1 and the adhesion layer 31 employed in the specific embodiment 2 can respectively be formed without effecting etching processing on the titanium nitride layers (23 and 32) for the adhesion layers, the manufacturing process can be shortened and made efficient.

Although the specific embodiment 1 has shown an example in which the through hole 18 whose aspect ratio is 3.5, is formed and the thickness dimension of the titanium nitride layer 23 deposited on the interlayer insulating film 17 is formed 10 nm, the present invention is not limited to it. It has been found out by experiments that a semiconductor device low in through hole resistance value can be manufactured even in terms of the relationship between each aspect ratio shown below and the thickness dimension of the titanium nitride layer 23 deposited on the interlayer insulating film 17 by sputtering.

That is, the relationship between the aspect ratio and the thickness dimension of the titanium nitride layer 23 deposited on the interlayer insulating film 17 is as follows. When the aspect ratio is over 2.5 and less than 3, the thickness dimension of the titanium nitride layer 23 deposited on the interlayer insulating film 17 may preferably be formed so as to range from over 7.5 nm to under 10 nm. When the aspect ratio is over 3 and less than 3.5, the thickness dimension of the titanium nitride layer 23 deposited on the interlayer insulating film 17 may preferably be formed so as to range from over 7.5 nm to under 20 nm. When the aspect ratio is over 3.5 and less than 4, the thickness dimension of the titanium nitride layer 23 deposited on the interlayer insulating film 17 may preferably be formed so as to range from over 7.5 nm to under 30 nm.

In the specific embodiment 2 described above, the titanium nitride layer 32 may be formed by a collimator sputter method, a long-range sputter method, an ion sputter method or the like. Any of the sputter methods is a sputter method having directivity.

According to the present invention, as described above, since the adhesion layer is formed based on the aspect ratio, the adhesion layer is not formed at the bottom surface of the through hole or the thickness dimension of the adhesion layer at the bottom surface of the through hole can be formed thin, thus making it possible to fabricate a semiconductor device low in through hole resistance value. Accordingly, a satisfactory semiconductor device can be obtained which does not incur a failure in operation developed due to a high through hole resistance value.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device comprising:
    forming a lower wiring on a substrate;
    covering the lower wiring and the substrate with an insulating film;
    forming a through hole in the insulating film that exposes the lower wiring;
    forming an adhesion layer on the insulating film within the through hole;
    forming a conductive plug within the through hole on the adhesion layer, the conductive plug electrically connected to the lower wiring; and
    forming an upper wiring on the insulating film, the upper wiring electrically connected to the conductive plug,
    said forming an adhesion layer including sputtering based on a predetermined aspect ratio indicated by a ratio of a depth dimension of the through hole to a diameter dimension of the through hole,
    wherein the adhesion layer is formed such that a relationship between a thickness dimension of a material deposited on the interlayer insulating film as the adhesion layer by said sputtering and the aspect ratio is provided so that
        when the aspect ratio is over 2.5 and less than 3, the thickness dimension of the deposited material ranges from over 7.5 nm to under 10 nm,
        when the aspect ratio is over 3 and less than 3.5, the thickness dimension of the deposited material ranges from over 7.5 nm to under 20 nm, and
        when the aspect ratio is over 3.5 and less than 4, the thickness dimension of the deposited material ranges from over 7.5 nm to under 30 nm.

2. The method of manufacturing a semiconductor device of claim 1, wherein the adhesion layer within the through hole is formed on the lower wiring as having a thickness which enables corrosive gas used during said forming a conductive plug to penetrate thereinto.

3. The method of manufacturing a semiconductor device of claim 1, wherein the lower wiring and the upper wiring are formed as laminated structures including a cap metal layer provided on an aluminum alloy layer.

4. The method of manufacturing a semiconductor device of claim 3, wherein the laminated structures are formed as having a high melting-point metal layer provided below the aluminum alloy layer.

5. The method of manufacturing a semiconductor device of claim 4, wherein the high melting-point metal layer is formed as a laminated layer of titanium nitride and titanium, or as a layer made of titanium nitride only.

6. The method of manufacturing a semiconductor device of claim 3, wherein the aluminum alloy layer is provided as an alloy made of aluminum and copper.

7. The method of manufacturing a semiconductor device of claim 3, wherein the cap metal layer is formed as a laminated layer of titanium nitride and titanium, or as a layer made of titanium nitride only.

8. The method of manufacturing a semiconductor device of claim 1, wherein the lower wiring is formed as having an extended linear dimension.

9. The method of manufacturing a semiconductor device of claim 1, wherein the conductive plug is formed as a tungsten plug.

10. The method of manufacturing a semiconductor device of claim 1, wherein the adhesion layer is formed using titanium nitride.

11. A method of manufacturing a semiconductor device comprising:
    forming a lower wiring on a substrate;
    covering the lower wiring and the substrate with an insulating film;

forming a through hole in the insulating film that exposes the lower wiring;

forming an adhesion layer on the insulating film within the through hole;

forming a conductive plug within the through hole on the adhesion layer, the conductive plug electrically connected to the lower wiring; and forming an upper wiring on the insulating film, the upper wiring electrically connected to the conductive plug, said forming an adhesion layer including sputtering based on a predetermined aspect ratio indicated by a ratio of a depth dimension of the through hole to a diameter dimension of the through hole, wherein the adhesion layer is formed such that a relationship between the aspect ratio and an incident angle of sputtering with respect to the substrate is provided so that the incident angle is 45° or more if the aspect ratio is over 1 and less than 1.5, the incident angle is 26° or more if the aspect ratio is over 1.5 and less than 2, and the incident angle is 18° or more if the aspect ratio is over 2.5 and less than 3.

12. A method of manufacturing a semiconductor device comprising:

forming a lower wiring on a substrate;

covering the lower wiring and the substrate with an insulating film;

forming a through hole in the insulating film that exposes the lower wiring;

forming an adhesion layer on the insulating film within the through hole;

forming a conductive plug within the through hole on the adhesion layer, the conductive plug electrically connected to the lower wiring; and forming an upper wiring on the insulating film, the upper wiring electrically connected to the conductive plug, said forming an adhesion layer including sputtering based on a predetermined aspect ratio indicated by a ratio of a depth dimension of the through hole to a diameter dimension of the through hole, so that a thickness of the adhesion layer on a sidewall of the through hole gradually decreases from a top of the through hole to a bottom of the through hole and so that the adhesion layer is not formed on the bottom of the through hole.

13. The method of manufacturing a semiconductor device of claim 12, wherein the adhesion layer is formed such that a relationship between the aspect ratio and an incident angle of sputtering with respect to the substrate is provided so that the incident angle is 45° or more if the aspect ratio is over 1 and less than 1.5, the incident angle is 26° or more if the aspect ratio is over 1.5 and less than 2, and the incident angle is 18° or more if the aspect ratio is over 2.5 and less than 3.

* * * * *